United States Patent
Kamigama et al.

(10) Patent No.: US 10,588,229 B2
(45) Date of Patent: Mar. 10, 2020

(54) HOUSING INCLUDING A CONTAINER AND A LID

(71) Applicant: YOKOGAWA ELECTRIC CORPORATION, Musashino-shi, Tokyo (JP)

(72) Inventors: Sunao Kamigama, Musashino (JP); Yuuto Kobayashi, Musashino (JP)

(73) Assignee: YOKOGAWA ELECTRIC CORPORATION, Musashino-shi, Tokyo (JP)

( * ) Notice: Subject to any disclaimer, the term of this patent is extended or adjusted under 35 U.S.C. 154(b) by 0 days.

(21) Appl. No.: 16/274,517

(22) Filed: Feb. 13, 2019

(65) Prior Publication Data

US 2019/0261526 A1  Aug. 22, 2019

(30) Foreign Application Priority Data

Feb. 22, 2018 (JP) ................. 2018-029744

(51) Int. Cl.
H05K 5/02 (2006.01)
H05K 5/06 (2006.01)
G01D 11/24 (2006.01)

(52) U.S. Cl.
CPC .......... H05K 5/0247 (2013.01); G01D 11/24 (2013.01); H05K 5/0239 (2013.01); H05K 5/069 (2013.01)

(58) Field of Classification Search
CPC ..... H05K 5/0247; H05K 5/069; H05K 5/0239
See application file for complete search history.

(56) References Cited

U.S. PATENT DOCUMENTS 5,162,845 A * 11/1992 Ariyama ............... G03G 15/00
                                                       271/303

FOREIGN PATENT DOCUMENTS

| JP | S5049692 U | 5/1975 |
| JP | S5343514 Y2 | 10/1978 |
| JP | S56143116 A | 11/1981 |
| JP | H0936569 A | 2/1997 |
| JP | 2010240330 A | * 10/2010 |
| JP | 2010240330 A | 10/2010 |
| JP | 2015015436 A | * 1/2015 |
| JP | 2015015436 A | 1/2015 |

OTHER PUBLICATIONS

Apr. 17, 2019, the Extended European Search Report issued by the European Patent Office in the corresponding European Patent Application No. 19156087.9.

* cited by examiner

Primary Examiner — Rockshana D Chowdhury
(74) Attorney, Agent, or Firm — Kenja IP Law PC

(57) ABSTRACT

A housing includes a container, a lid configured to open and close the container, a cable connecting the container and the lid, and a torsion coil spring. The cable has a surplus length portion that is drawn from a surplus length storage space, which is partitioned off within the container, by the lid being opened or closed. The torsion coil spring is configured to bias the cable towards the surplus length storage space.

10 Claims, 8 Drawing Sheets

HOUSING INCLUDING A CONTAINER AND A LID

CROSS-REFERENCE TO RELATED APPLICATION

The present application claims priority to and the benefit of Japanese Patent Application No. 2018-29744 filed Feb. 22, 2018, the entire contents of which are incorporated herein by reference.

TECHNICAL FIELD

The present disclosure relates to a housing.

BACKGROUND

A known housing includes a container, a lid, and a cable connecting the container and the lid. The known housing is configured so that a surplus length portion of the cable is drawn from a surplus length storage space, partitioned off within the container, by the lid being opened or closed. Such a housing is configured to bias the cable towards the surplus length storage space, for example as disclosed in patent literature (PTL) 1 and 2.

CITATION LIST

Patent Literature

PTL 1: Japanese Examined Utility Model Application Publication No. S53-43514Y
PTL 2: Patent Application Publication No. H9-36569

SUMMARY

A housing according to an embodiment includes a container, a lid configured to open and close the container, a cable connecting the container and the lid, and a torsion coil spring. The cable includes a surplus length that is drawn from a surplus length storage space by the lid being opened or closed. The surplus length storage space is partitioned off within the container. The torsion coil spring is configured to bias the cable towards the surplus length storage space.

BRIEF DESCRIPTION OF THE DRAWINGS

In the accompanying drawings.

DETAILED DESCRIPTION

Figure 1:
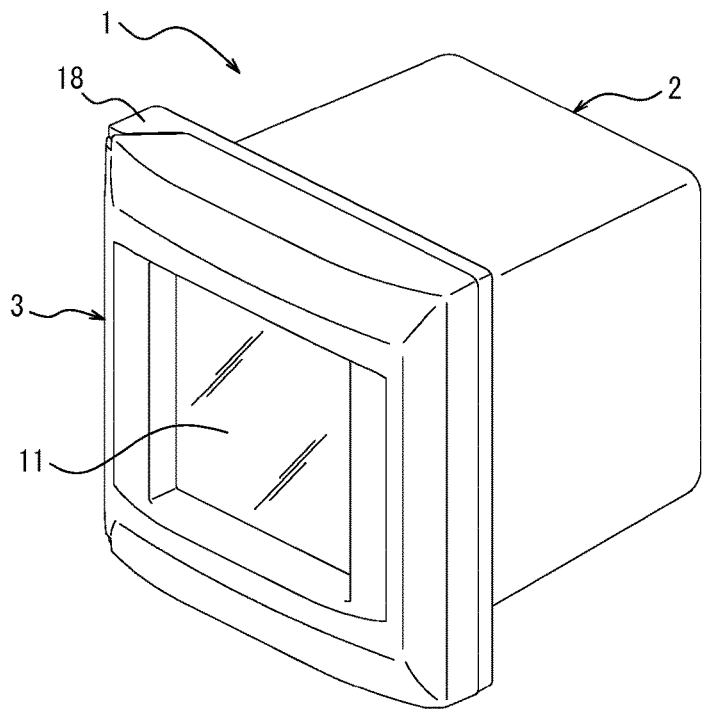
FIG. 1 is a perspective view of a housing, according to an embodiment, with the lid closed.

An extension coil spring requires the coil to have a certain diameter in order to achieve sufficient stroke and biasing force. Consequently, it is difficult to reduce the thickness of the cable biasing mechanism in housings comprising an extension coil spring to bias the cable.

It would therefore be helpful to provide a housing that facilitates a reduction in the thickness of the cable biasing mechanism, thereby facilitating expansion of the usable interior space.

A housing according to an embodiment includes a container, a lid configured to open and close the container, a cable connecting the container and the lid, and a torsion coil spring. The cable includes a surplus length that is drawn from a surplus length storage space by the lid being opened or closed. The surplus length storage space is partitioned off within the container. The torsion coil spring is configured to bias the cable towards the surplus length storage space. The axial direction of the coil of the torsion coil spring is aligned with the thickness direction of the biasing mechanism of the cable in this configuration, thereby allowing a reduction in the thickness of the biasing mechanism.

In another embodiment, the housing may further include an engagement plate fixed to the cable, and the torsion coil spring may include a movable arm that extends along the engagement plate and engages with the engagement plate. This configuration allows a reduction in thickness of the portion connecting the torsion coil spring and the cable.

In another embodiment, the container of the housing may include an engagement plate guide configured to guide the engagement plate to move in a storage direction that is a direction from the lid towards the surplus length storage space and a withdrawal direction that is an opposite direction from the storage direction. This configuration can restrict the motion range of the cable and can therefore expand the usable interior space.

In another embodiment, the engagement plate of the housing may include a storage stopper configured to restrict movement of the engagement plate in the storage direction by abutting against the container, and/or a withdrawal stopper configured to restrict movement of the engagement plate in the withdrawal direction by abutting against the container. This configuration can restrict the motion range of the cable and can therefore expand the usable interior space.

In another embodiment, the engagement plate of the housing may include an elongated hole that engages with the movable arm and is perpendicular to the storage direction. This configuration allows a stable connection between the torsion coil spring and the cable with a simple configuration.

In another embodiment, the lid of the housing may be rotatably connected to the container via a hinge, and the housing may further include a pair of protective sheets arranged to sandwich the cable, the protective sheets being fixed to the cable and reversibly deforming in accordance with rotation of the lid. When the lid is a rotatable lid, this configuration can restrict the motion range of the cable while protecting the cable and can therefore expand the usable interior space.

In another embodiment, the container may include a protective sheet guide that guides the pair of protective sheets to move in a storage direction that is a direction from the lid towards the surplus length storage space and a withdrawal direction that is an opposite direction from the storage direction. This configuration can stably restrict the motion range of the cable and can therefore expand the usable interior space.

In another embodiment, the entire length of one protective sheet in the pair of protective sheets of the housing may be anchored to the cable, with at least a portion of the entire length of the other protective sheet in the pair of protective sheets not being anchored to the cable. This configuration can reduce the load placed on the cable at the portion connecting the cable and the pair of protective sheets.

In another embodiment, the housing may be configured so that the container includes an outer container and an inner container contained in the outer container, the cable is arranged between the outer container and the inner container, the lid is rotatably connected to the outer container via a hinge, one end of the cable is connected to a back side of the lid, the other end of the cable is connected to the inner container, and the inner container includes the engagement plate guide. When the lid is a rotatable lid, this configuration can restrict the motion range of the cable with a simple configuration and can thereby expand the usable interior space.

The present disclosure can provide a housing that facilitates a reduction in the thickness of the cable biasing mechanism, thereby facilitating expansion of the usable interior space.

Various embodiments of the present disclosure are described and exemplified below in detail with reference to the drawings.

Figure 2:
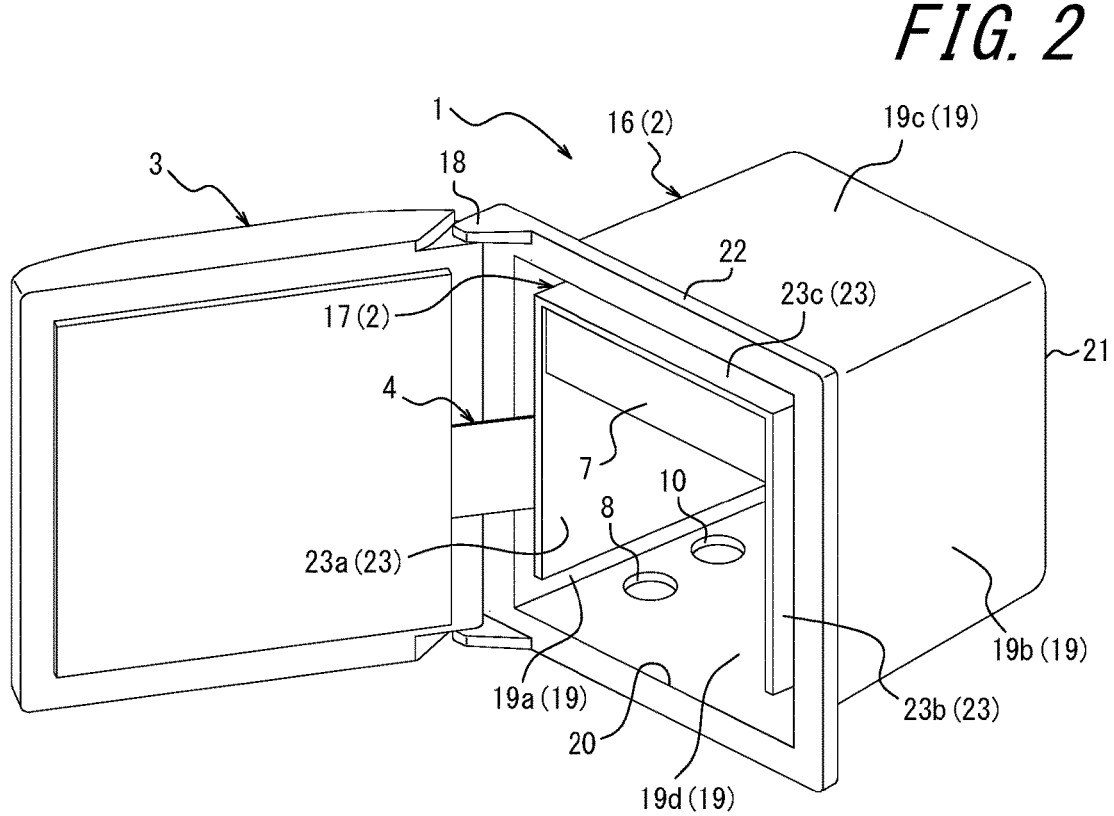
FIG. 2 is a perspective view of the housing in FIG. 1 with the lid open.
Figure 3:
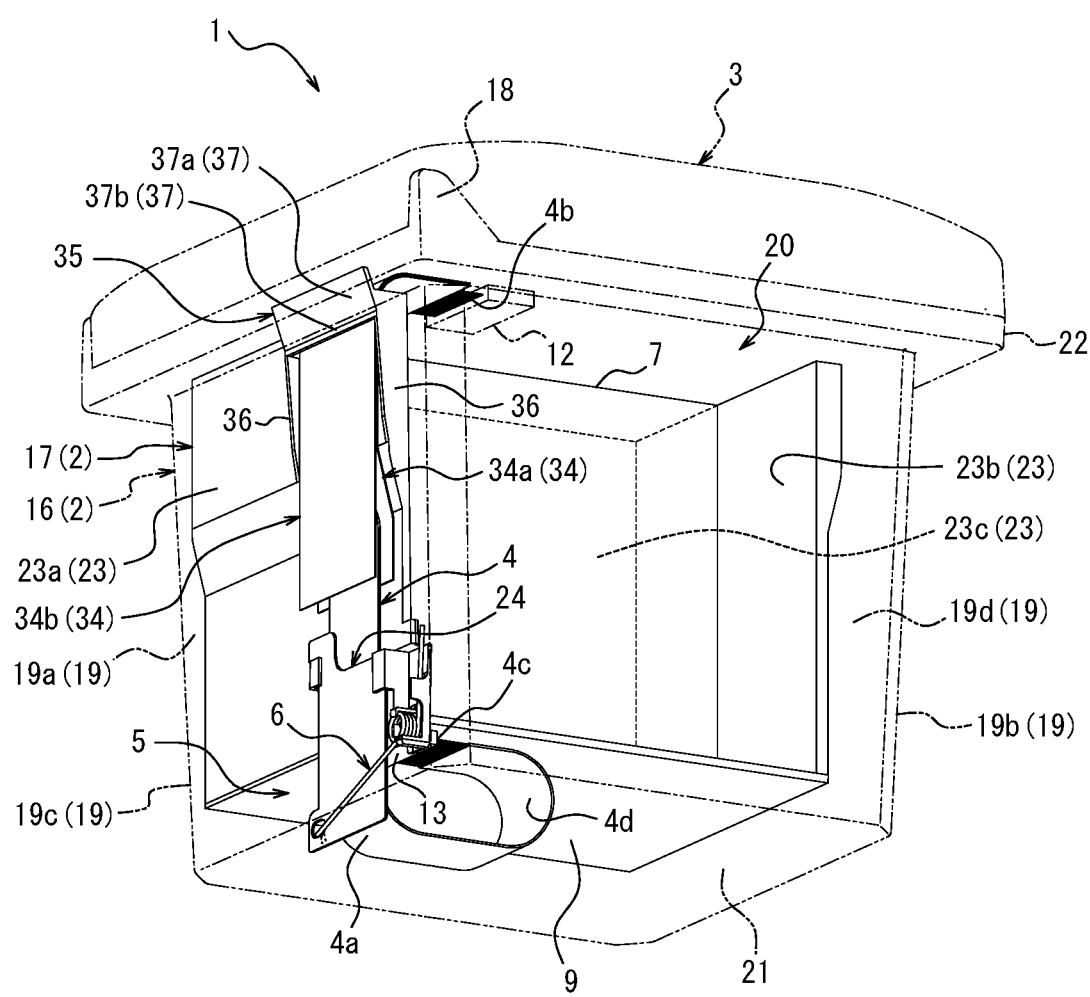
FIG. 3 is a perspective view, from a different angle, of the housing in FIG. 1 with the lid closed.
Figure 7:
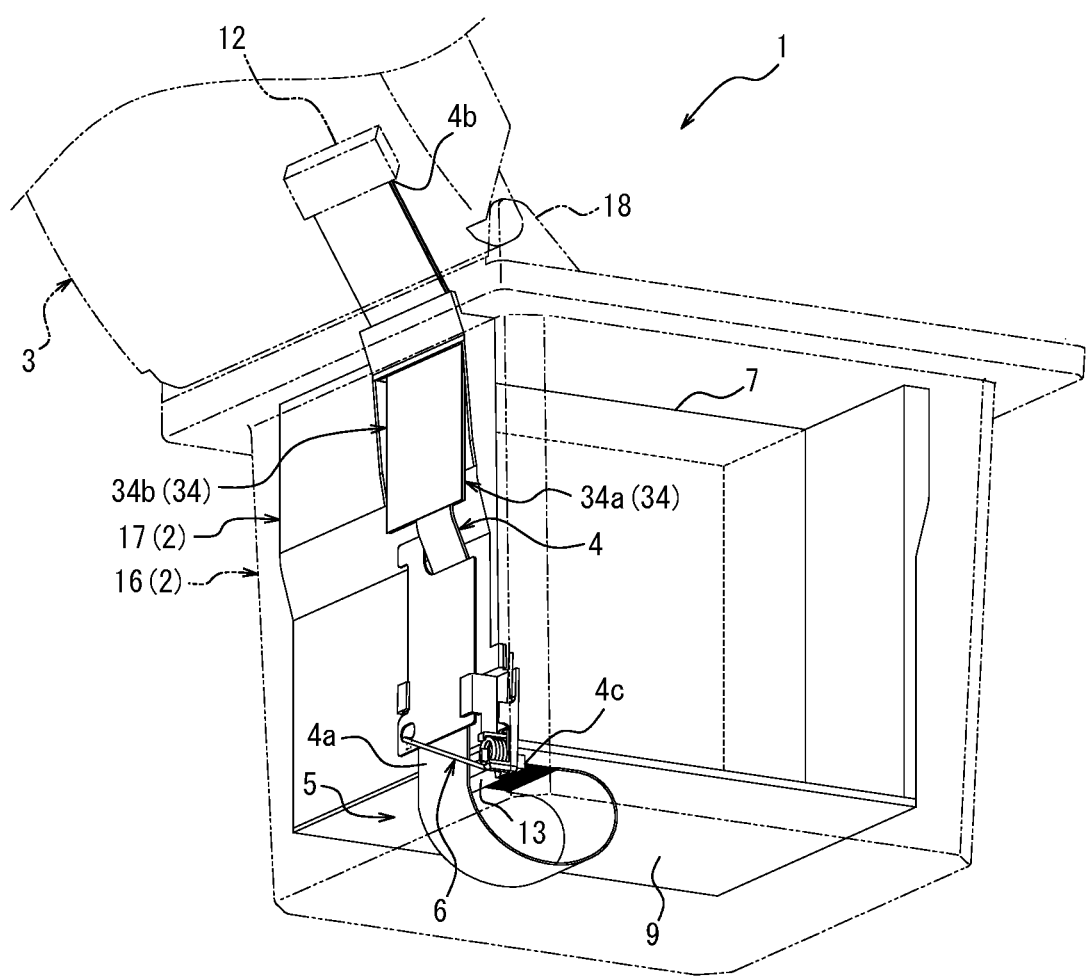
FIG. 7 is a perspective view, from a different angle, of the housing in FIG. 2 with the lid open.

As illustrated in FIGS. 1 to 3, a housing 1 of the present embodiment includes a container 2, a lid 3 capable of opening and closing the container 2, and a cable 4 connecting the container 2 and the lid 3. The cable 4 has a surplus length portion 4a (see FIG. 3, FIG. 7) that is drawn from a surplus length storage space 5 by the lid 3 being opened. The surplus length storage space 5 is partitioned off within the container 2. The housing 1 further includes a torsion coil spring 6 that biases the cable 4 towards the surplus length storage space 5. Details on these components are provided below.

In the present embodiment, the housing 1 constitutes a liquid analyzer capable of measuring pH (hydrogen ion exponent) or the like. The housing 1 is not, however, limited to constituting such a liquid analyzer. The housing 1 may, for example, be used to constitute a gas analyzer or an apparatus other than an analyzer.

The measurement apparatus 7 and an internal power source (not illustrated) are arranged in the interior space of the container 2. The measurement apparatus 7 is connected to a detector (not illustrated), located outside of the housing 1, by a cable (not illustrated) through a first access port 8. The measurement apparatus 7 is also connected to a circuit board 9 provided in the container 2. The internal power source connects to an external power source (not illustrated), located outside of the housing 1, through a second access port 10 and is also connected to the circuit board 9.

A panel 11 capable of displaying measured values, such as pH, is provided on the surface of the lid 3. The panel 11 is formed by a touch panel and also functions as an input interface for input from a user. The panel 11 is connected to the circuit board (not illustrated) provided in the lid 3. A processor, which performs the overall control functions of the liquid analyzer, and a memory are arranged on this circuit board. The processor and the memory may instead be arranged on the circuit board 9 provided in the container 2.

A first connector 12 is provided on the circuit board located in the lid 3. One end 4b of the cable 4 is connected to the first connector 12. A second connector 13 is provided in the circuit board 9 located in the container 2. The other end 4c of the cable 4 is connected to the second connector 13. The cable 4 includes a plurality of wires 14 (see FIG. 6) arranged in a row. In the present embodiment, these wires 14 include communication lines and power transmission lines. These wires 14 are bundled together by a jacket 15 across a partial length of the wires 14. The wires 14 may, however, be bundled together by the jacket 15 across the entire length of the wires 14.

Since the circuit board of the lid 3 and the circuit board 9 of the container 2 are connected by the cable 4, the measurement apparatus 7 can respond to input from the panel 11 by processing a signal from the detector to obtain a measured value, and the measured value can be displayed on the panel 11.

Figure 9:
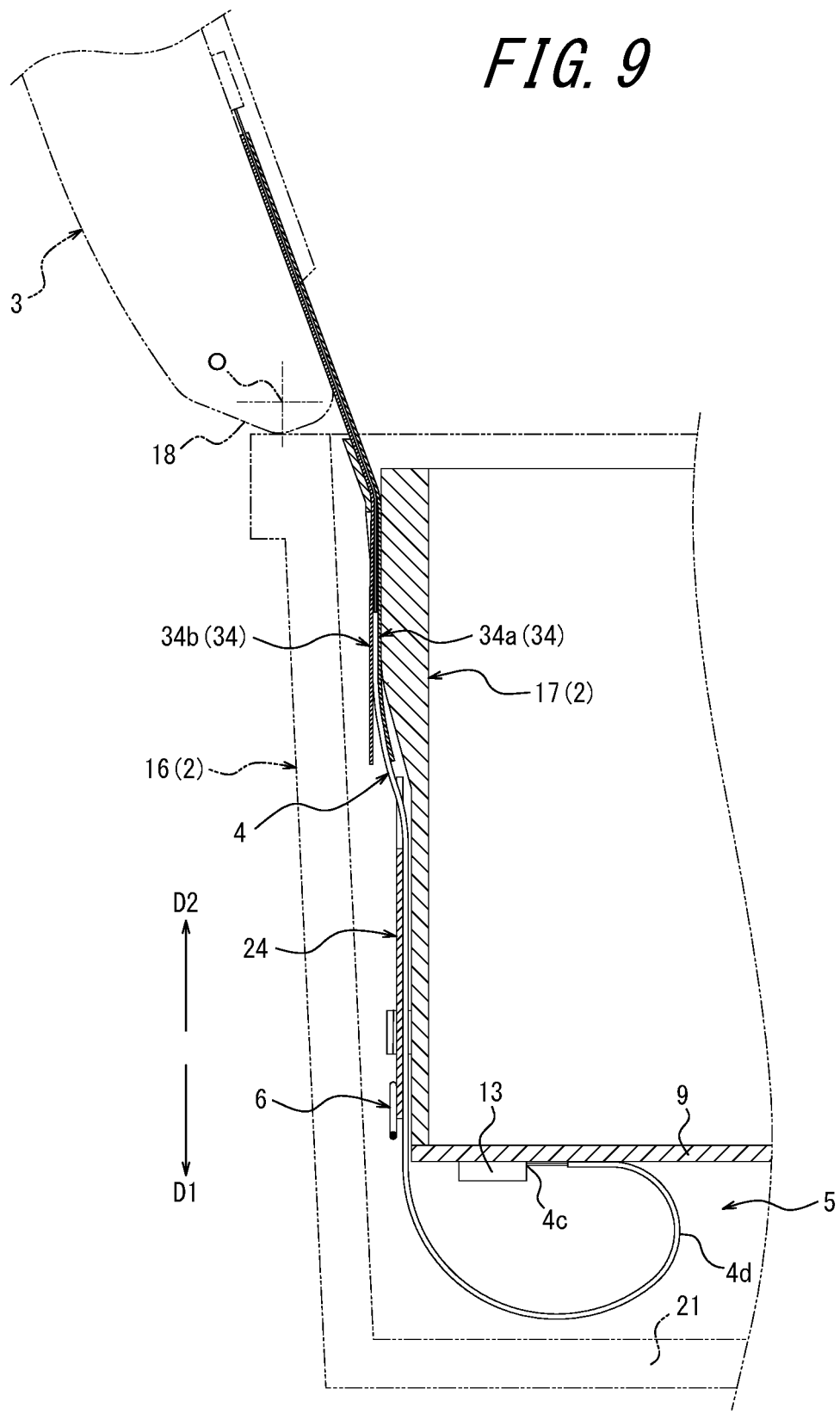
FIG. 9 is a cross-section along the A'-A' line in FIG. 8.

As illustrated in FIG. 1 to FIG. 3, the container 2 of the present embodiment includes an outer container 16 and an inner container 17 contained in the outer container 16. The lid 3 is rotatably connected to the outer container 16 via a hinge 18. The cable 4 is arranged between the outer container 16 and the inner container 17. The one end 4b of the cable 4 is connected to the back side of the lid 3 by the first connector 12. The other end 4c of the cable 4 is connected to the inner container 17 by the second connector 13. Consequently, as illustrated in FIG. 9, a portion of the cable 4 is drawn towards the lid 3 from between the outer container 16 and the inner container 17 when the lid 3 is rotated in the opening direction about an axis O of the hinge 18.

As illustrated in FIG. 2 and FIG. 3, the outer container 16 includes a first outer peripheral wall 19a on the side where the hinge 18 is arranged, a second outer peripheral wall 19b opposite the first outer peripheral wall 19a, and a third outer peripheral wall 19c and fourth outer peripheral wall 19d connecting the first outer peripheral wall 19a and the second outer peripheral wall 19b. The first access port 8 and the second access port 10 are provided on the fourth outer peripheral wall 19d. One end of the outer peripheral walls 19 formed by the first outer peripheral wall 19a, second outer peripheral wall 19b, third outer peripheral wall 19c, and fourth outer peripheral wall 19d defines an opening 20 that can be opened and closed by the lid 3. The other end of the outer peripheral walls 19 is blocked by a back wall 21. A flange 22 is connected to one end of the outer peripheral walls 19, and the hinge 18 is arranged on the flange 22.

The inner container 17 includes a first inner wall 23a opposite the first outer peripheral wall 19a, a second inner wall 23b opposite the first inner wall 23a, and a third inner wall 23c connecting the first inner wall 23a and the second inner wall 23b. The second inner wall 23b is opposite the second outer peripheral wall 19b, and the third inner wall 23c is opposite the third outer peripheral wall 19c. An inner frame 23 is formed by the first inner wall 23a, second inner wall 23b, and third inner wall 23c. One substantially U-shaped end of the inner frame 23 faces the opening 20. The circuit board 9 is connected to the other substantially U-shaped end of the inner frame 23. The circuit board 9 is board shaped and is arranged opposite the back wall 21. The inner container 17 is formed by the inner frame 23 and the circuit board 9.

Figure 4:
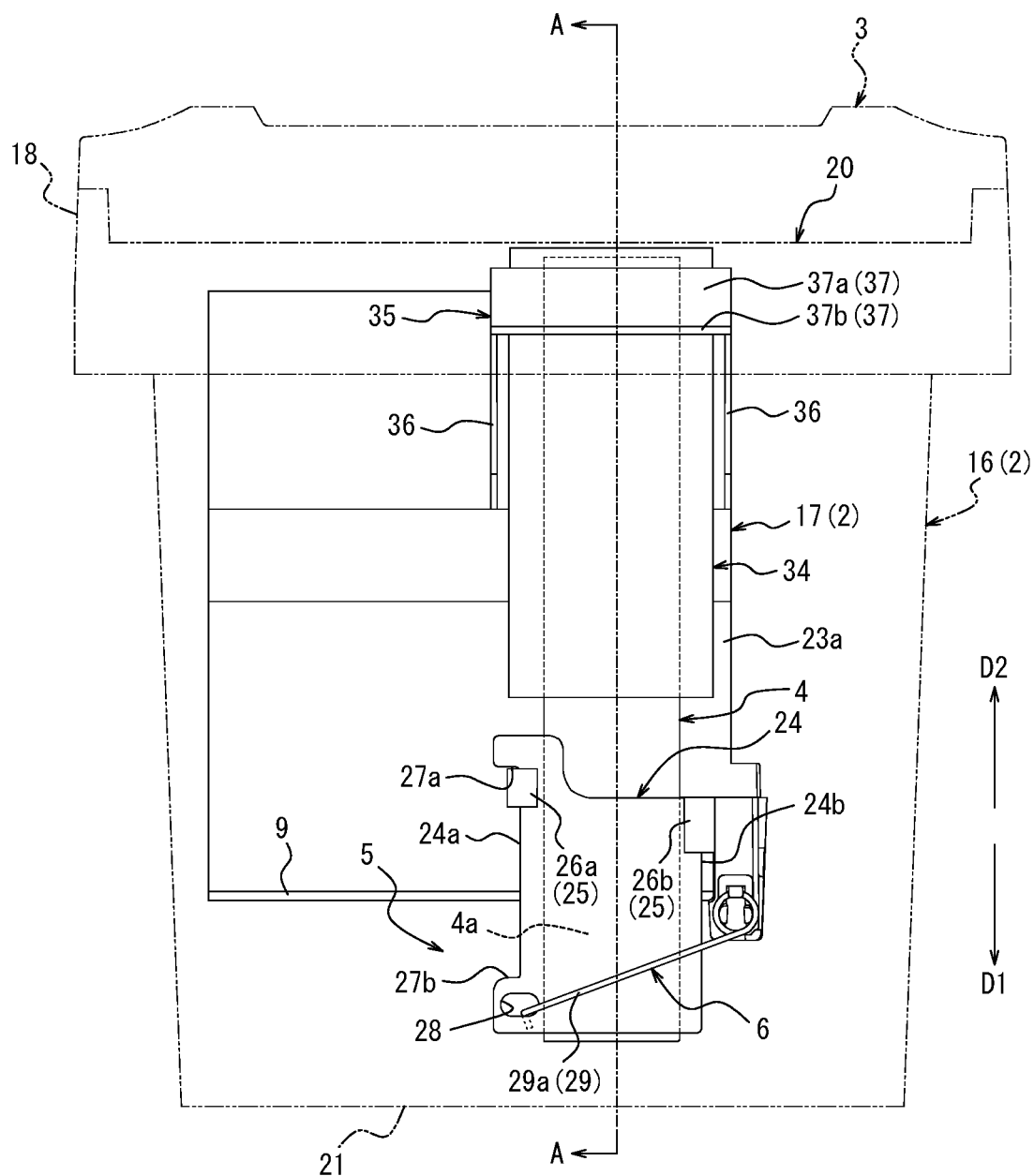
FIG. 4 is a plan view, from another different angle, of the housing in FIG. 1 with the lid closed.
Figure 5:
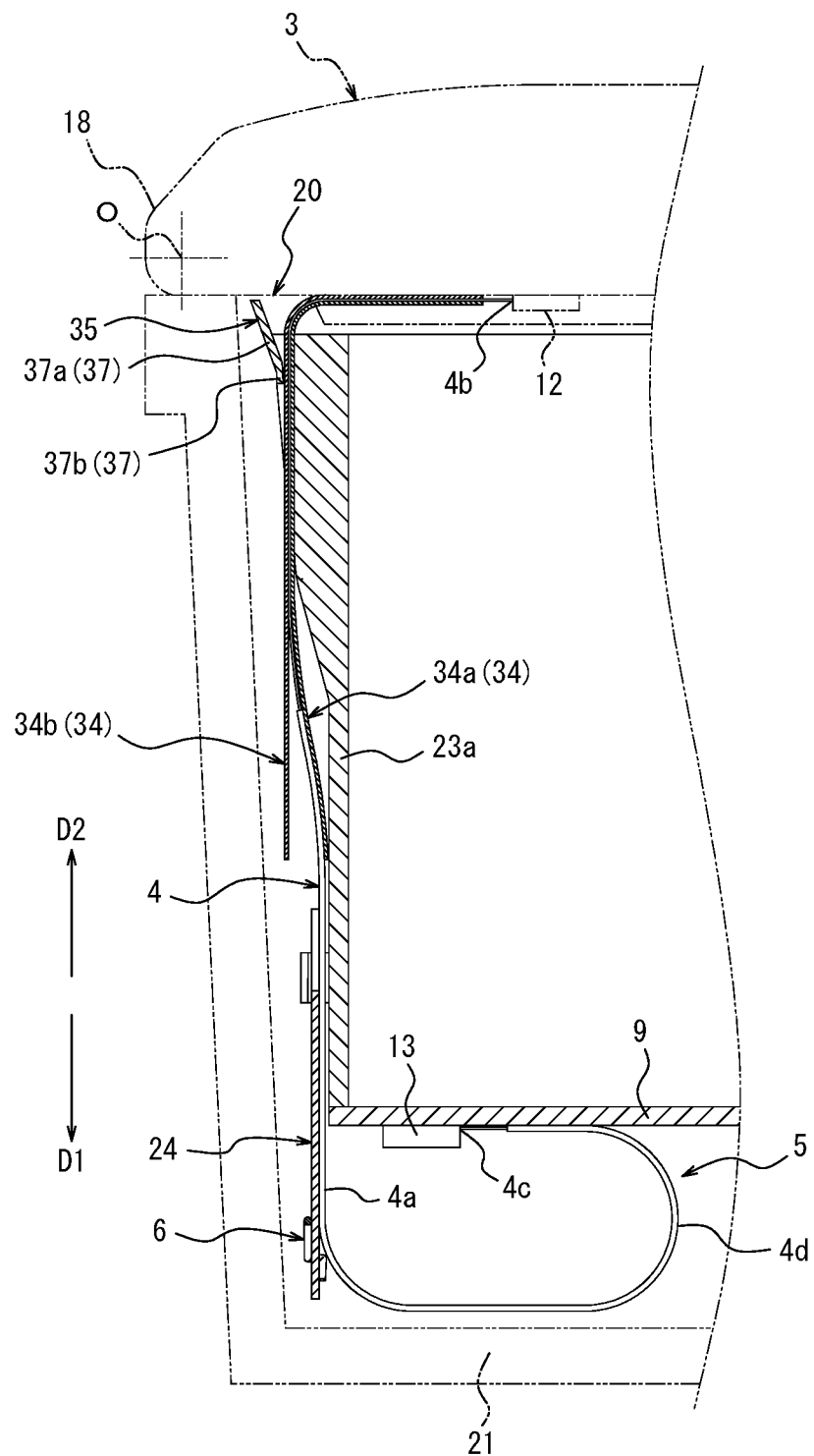
FIG. 5 is a cross-section along the A-A line in FIG. 4.

As illustrated in FIG. 3 to FIG. 5, the surplus length storage space 5 is partitioned off by the circuit board 9 and the back wall 21. In the surplus length storage space 5, the cable 4 extends towards the second inner wall 23b from the other end 4c connected to the second connector 13 and turns back in the opposite direction at an inverted portion 4d that curves towards the back wall 21. The cable 4 extends from the inverted portion 4d towards the first inner wall 23a, curves to be in a direction along the first inner wall 23a, and extends along the first inner wall 23a until reaching the opening 20.

In a state in which the opening 20 is closed by the lid 3 (i.e., a closed state), the cable 4 curves at the opening 20 from the direction along the first inner wall 23a to a direction towards the second inner wall 23b and extends to the one end 4b connected to the first connector 12 of the lid 3.

An engagement plate 24 is fixed to the cable 4. In the present embodiment, the engagement plate 24 is anchored to the surplus length portion 4a of the cable 4. The engagement plate 24 may be anchored to a portion other than the surplus length portion 4a.

Figure 6:
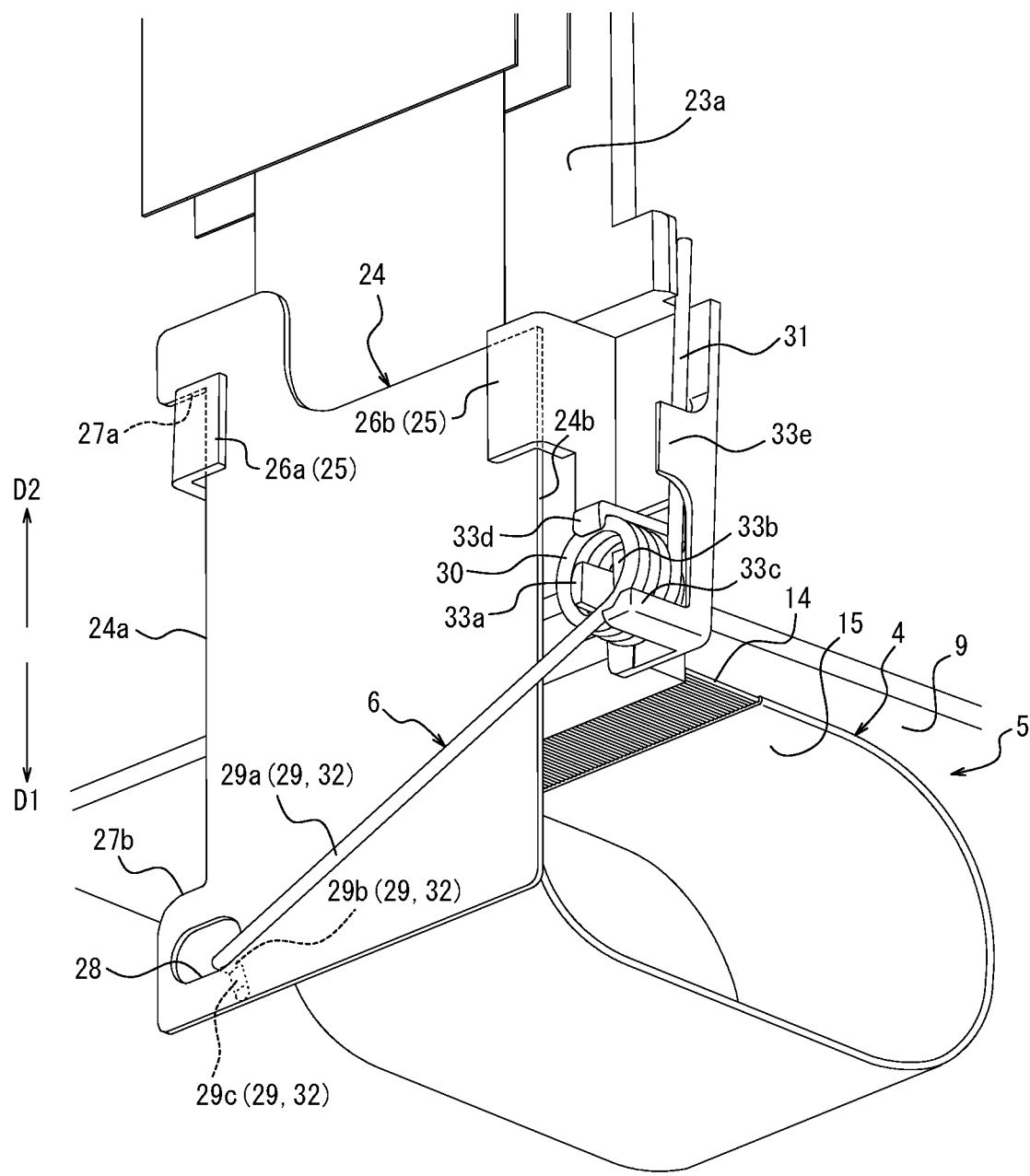
FIG. 6 is an enlarged view of a portion of FIG. 3.

As illustrated in FIG. 4 and FIG. 6, an engagement plate guide 25 is provided on the outer surface of the first inner wall 23a of the inner container 17. The engagement plate guide 25 guides the engagement plate 24 to move in a storage direction D1, which is a direction from the lid 3 towards the surplus length storage space 5, and a withdrawal direction D2, which is the opposite direction from the storage direction D1. The engagement plate guide 25 includes a first hook 26a that engages with a first edge 24a of the engagement plate 24 and a second hook 26b that engages with a second edge 24b of the engagement plate 24. The engagement plate guide 25 is not, however, limited to being formed by the first hook 26a and the second hook 26b. The engagement plate guide 25 may also be omitted.

Figure 8:
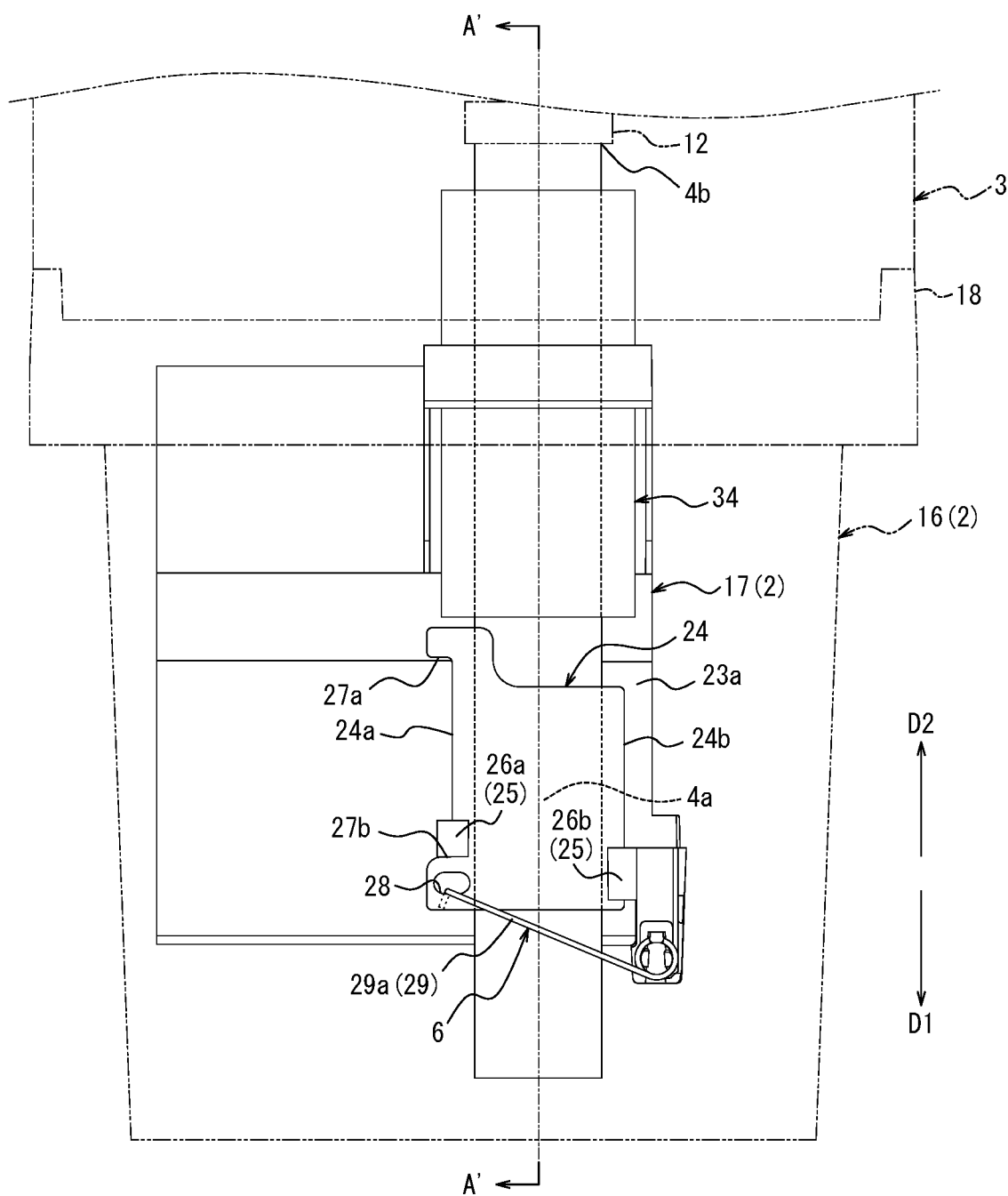
FIG. 8 is a plan view, from another different angle, of the housing in FIG. 2 with the lid open.

A storage stopper 27a formed by a protrusion protruding in the width direction is provided at one end, in the withdrawal direction D2, of the first edge 24a of the engagement plate 24. As illustrated in FIG. 4, the storage stopper 27a can restrict movement of the engagement plate 24 in the storage direction D1 by abutting against the first hook 26a. A withdrawal stopper 27b formed by a protrusion protruding in the width direction is provided at the other end of the first edge 24a of the engagement plate 24. As illustrated in FIG. 8, the withdrawal stopper 27b can restrict movement of the engagement plate 24 in the withdrawal direction D2 by abutting against the first hook 26a. The storage stopper 27a and/or the withdrawal stopper 27b may, however, be omitted.

As illustrated in FIG. 6, an elongated hole 28 perpendicular to the storage direction D1 is provided in the protrusion constituting the withdrawal stopper 27b. A movable arm 29 of the torsion coil spring 6 is engaged with the elongated hole 28. The torsion coil spring 6 includes a coil 30 having one or more turns, a first arm 31 extending from one end of the coil 30, and a second arm 32 extending from the other end of the coil 30. The first arm 31 and the second arm 32 are mutually displaceable in the twisting direction of the coil 30. The coil 30 is arranged further outward in the width direction of the engagement plate 24 than the second edge 24b of the engagement plate 24. The coil 30 is fixed by a first projection 33a, a second projection 33b, a third projection 33c, and a fourth projection 33d provided on a protrusion protruding in the storage direction D1 from the bottom edge of the first inner wall 23a. The first projection 33a and the second projection 33b engage with the inner peripheral surface of the coil 30, whereas the third projection 33c and the fourth projection 33d engage with the outer peripheral surface of the coil 30. The fourth projection 33d is hook-shaped and locks the coil 30 so that the coil 30 does not slide out in the axial direction. The shape, number, and the like of projections for fixing the coil 30 may be changed as necessary. The coil 30 may also be fixed by a configuration other than projections. The first arm 31 abuts against a fifth projection 33e provided on the first inner wall 23a, thereby restricting rotation of the first arm 31 in the direction that increases the angle between the first arm 31 and the second arm 32. The configuration for restricting rotation of the first arm 31 may be changed as necessary. The second arm 32 functions as the movable arm 29 that engages with the elongated hole 28.

The movable arm 29 includes an arm body 29a extending along the engagement plate 24, a first bend 29b that bends from the tip of the arm body 29a in an L-shape and passes through the elongated hole 28, and a second bend 29c that bends again in an L-shape from the tip of the first bend 29b and extends along the engagement plate 24. The movable arm 29 applies an elastic force produced by the torsion coil spring 6 to the engagement plate 24 by the first bend 29b abutting against the edge of the elongated hole 28 on the storage direction D1 side. In other words, the torsion coil spring 6 can bias the engagement plate 24 in the storage direction D1. In the present embodiment, the biasing force of the torsion coil spring 6 is applied to the engagement plate 24 not only when the engagement plate 24 is positioned furthest on the withdrawal direction D2 side, as illustrated in FIG. 8, but also when the engagement plate 24 is positioned furthest on the storage direction D1 side, as illustrated in FIG. 4. However, a configuration may be adopted so that when the engagement plate 24 is positioned furthest on the storage direction D1 side, the movable arm 29 separates from the edge of the elongated hole 28 and no longer applies the biasing force to the engagement plate 24.

Since the movable arm 29 is engaged with the engagement plate 24 through the elongated hole 28 in the present embodiment, the engaging portion (i.e. the first bend 29b) of the movable arm 29 can be caused to slide in the width direction of the engagement plate 24 when the movable arm 29 rotates in accordance with movement of the engagement plate 24 in the storage direction D1 and the withdrawal direction D2. Accordingly, rotational motion of the movable arm 29 can be stably converted into linear motion of the engagement plate 24. Instead of such an elongated hole 28, a notch perpendicular to the storage direction D1 may be provided in the engagement plate 24, for example. In other words, the engaging portion provided in the engagement plate 24 for engagement with the movable arm 29 is not limited to the elongated hole 28 and may, for example, be a notch perpendicular to the storage direction D1. The position of the engaging portion provided in the engagement plate 24 for engagement with the movable arm 29 may also be changed as necessary. The engaging portion (i.e. the elongated hole 28, notch, or the like) is preferably provided on the opposite side from the coil 30 of the torsion coil spring 6. This arrangement achieves a longer stroke of the engagement plate 24 for the same rotation range of the movable arm 29.

As illustrated in FIG. 3 to FIG. 5, a pair of protective sheets 34 is fixed to the cable 4 between the lid 3 and the engagement plate 24. This pair of protective sheets 34 is formed by a first protective sheet 34a between the first inner wall 23a and the cable 4 and a second protective sheet 34b between the first outer peripheral wall 19a and the cable 4. The pair of protective sheets 34 thus sandwiches the cable 4. As illustrated in FIG. 9, the pair of protective sheets 34 has sufficient flexibility to reversibly deform in accordance with rotation of the lid 3. When the cable 4 moves in accordance with rotation of the lid 3, this configuration can reduce the probability of contact between the cable 4 and a non-smooth portion near the opening 20 (for example, the corner of the first inner wall 23a) and can reduce the probability of the cable 4 being disconnected.

In the present embodiment, the entire length of the first protective sheet 34a, which is one sheet in the pair of protective sheets 34, is anchored to the cable 4. At least a portion of the entire length of the second protective sheet 34b, which is the other sheet in the pair of protective sheets 34, is not anchored to the cable 4. When the cable 4 and the pair of protective sheets 34 reversibly deform in accordance with rotation of the lid 3, this configuration allows relative displacement between the cable 4 and the other plate in the pair of protective sheets 34 occurring due to a difference in the radius of curvature between the inner peripheral side and the outer peripheral side at the portion that reversibly deforms. This configuration can therefore reduce the load (stress) on the cable 4. A configuration may be adopted in which at least a portion of the entire length of the first protective sheet 34a is not anchored to the cable 4, and in which the entire length of the second protective sheet 34b is anchored to the cable 4. The pair of protective sheets 34 may also be omitted.

As illustrated in FIG. 3 through FIG. 5, a protective sheet guide 35 is provided on the first inner wall 23a of the inner container 17. The protective sheet guide 35 guides the pair of protective sheets 34 to move in the storage direction D1 and the withdrawal direction D2. The protective sheet guide 35 is formed by a pair of guide ribs 36 extending in the storage direction D1 and a connecting plate 37 that connects the guide ribs 36. The pair of protective sheets 34 is arranged so as to pass through the protective sheet guide 35. A first portion 37a, which is the portion of the connecting plate 37 on the opening 20 side, has a plate shape extending towards the opening 20 and inclined to the hinge 18 side. A second portion 37b, which is the portion of the connecting plate 37 on the surplus length storage space 5 side, has a plate shape extending in parallel to the first inner wall 23a. The configuration of the protective sheet guide 35, however, is not limited to the pair of guide ribs 36 and the connecting plate 37. The protective sheet guide 35 may also be omitted.

As described above, the housing 1 of the present embodiment includes a torsion coil spring 6 that biases the cable 4 towards the surplus length storage space 5. Consequently, by the axial direction of the coil 30 of the torsion coil spring 6 being aligned with the thickness direction of the biasing mechanism of the cable 4, the housing 1 of the present embodiment can easily reduce the thickness of the biasing mechanism. In other words, this arrangement easily allows an increase in the diameter of the coil 30 to increase the stroke and the biasing force of the torsion coil spring 6.

In the housing 1 of the present embodiment, the torsion coil spring 6 is arranged so that the movable arm 29 of the torsion coil spring 6 that engages with the engagement plate 24 extends along the engagement plate 24. Consequently, the housing 1 of the present embodiment can easily achieve a biasing mechanism of the cable 4 that can reduce thickness and also allow stable operation.

The above embodiment is only an example of the present disclosure, and a variety of modifications may be made.

The housing 1 in the above embodiment is configured so that the surplus length portion 4a of the cable 4 is drawn from the surplus length storage space 5 by the lid 3 being opened. The housing 1 may, however, be configured so that the surplus length portion 4a of the cable 4 is drawn from the surplus length storage space 5 by the lid 3 being closed.

The lid 3 is rotatably connected to the container 2 via the hinge 18 in the above embodiment. The lid 3 is not limited to a rotating lid, however, and may be a sliding lid or a detachable lid.

The outer container 16 is shaped as a box in the above embodiment, but the shape may be changed as necessary. Similarly, the shape of the inner container 17 may also be changed as necessary to match the shape of the outer container 16. The container 2 is formed by the outer container 16 and the inner container 17 in the above embodiment, but this configuration is not limiting.

The housing 1 in the above embodiment is configured to bias the cable 4 with the torsion coil spring via the engagement plate 24, but this configuration is not limiting. For example, the housing 1 may be configured to bias the cable 4 with the torsion coil spring via a member that is not plate-shaped.

The invention claimed is:

1. A housing comprising:
   a container;
   a lid configured to open and close the container; a cable connecting the container and the lid; and a torsion coil spring; wherein
      the cable includes a surplus length portion that is drawn from a surplus length storage space by the lid being opened or closed, the surplus length storage space being partitioned off within the container;
      the torsion coil spring is configured to bias the cable towards the surplus length storage space; and
      an axial direction of the torsion coil spring is aligned with a thickness direction of a biasing mechanism of the cable; and
      wherein an engagement plate fixed to the cable; wherein the torsion coil spring comprises a movable arm that extends along the engagement plate and engages with the engagement plate; and
      wherein the lid is rotatably connected to the container via a hinge; and the housing further comprises a pair of protective sheets arranged to sandwich the cable, the protective sheets being fixed to the cable and reversibly deforming in accordance with rotation of the lid.

2. The housing of claim 1, wherein the container comprises an engagement plate guide configured to guide the engagement plate to move in a storage direction that is a direction from the lid towards the surplus length storage space and a withdrawal direction that is an opposite direction from the storage direction.

3. The housing of claim 2, wherein the engagement plate comprises:
   a storage stopper configured to restrict movement of the engagement plate in the storage direction by abutting against the container, or
   a withdrawal stopper configured to restrict movement of the engagement plate in the withdrawal direction by abutting against the container.

4. The housing of claim 2, wherein the engagement plate comprises an elongated hole that engages with the movable arm and is perpendicular to the storage direction.

5. The housing of claim 1, wherein the container comprises a protective sheet guide that guides the pair of protective sheets to move in a storage direction that is a direction from the lid towards the surplus length storage space and a withdrawal direction that is an opposite direction from the storage direction.

6. The housing of claim 1, wherein an entire length of one protective sheet in the pair of protective sheets is anchored to the cable; and
   at least a portion of an entire length of the other protective sheet in the pair of protective sheets is not anchored to the cable.

7. The housing of claim 2, wherein
   the container comprises an outer container and an inner container contained in the outer container;

the cable is arranged between the outer container and the inner container;

the lid is rotatably connected to the outer container via a hinge;

one end of the cable is connected to a back side of the lid;

the other end of the cable is connected to the inner container; and the inner container comprises the engagement plate guide.

8. A housing comprising: a container;

a lid configured to open and close the container; a cable connecting the container and the lid; and a torsion coil spring; wherein the cable includes a surplus length portion that is drawn from a surplus length storage space by the lid being opened or closed, the surplus length storage space being partitioned off within the container;

the torsion coil spring is configured to bias the cable towards the surplus length storage space; and wherein the torsion coil spring is configured to bias the cable using rotational force of the torsion coil spring rather than elongational force of the torsional coil spring; and wherein an engagement plate fixed to the cable; wherein the torsion coil spring comprises a movable arm that extends along the engagement plate and engages with the engagement plate; and wherein the lid is rotatably connected to the container via a hinge; and the housing further comprises a pair of protective sheets arranged to sandwich the cable, the protective sheets being fixed to the cable and reversibly deforming in accordance with rotation of the lid.

9. A housing comprising: a container;

a lid configured to open and close the container; a cable connecting the container and the lid; and a torsion coil spring; wherein the cable includes a surplus length portion that is drawn from a surplus length storage space by the lid being opened or closed, the surplus length storage space being partitioned off within the container;

the torsion coil spring is configured to bias the cable towards the surplus length storage space; and a projection is configured to prevent the torsion coil spring from extending in an axial direction; and wherein an engagement plate fixed to the cable; wherein the torsion coil spring comprises a movable arm that extends along the engagement plate and engages with the engagement plate; and wherein the lid is rotatably connected to the container via a hinge; and the housing further comprises a pair of protective sheets arranged to sandwich the cable, the protective sheets being fixed to the cable and reversibly deforming in accordance with rotation of the lid.

10. The housing of claim 9, wherein the projection is hook-shaped.

* * * * *